United States Patent
Ramaswamy et al.

(10) Patent No.: US 6,609,235 B2
(45) Date of Patent: Aug. 19, 2003

(54) METHOD FOR PROVIDING A FILL PATTERN FOR AN INTEGRATED CIRCUIT DESIGN

(75) Inventors: S. Ram Ramaswamy, Chantilly, VA (US); Charles N. Alcorn, Centreville, VA (US); Arnett J. Brown, III, Chapel Hill, NC (US); Tatia E. Butts, Manassas, VA (US)

(73) Assignee: Bae Systems Information and Electronic Systems Integration, Inc., Nashua, NH (US)

( * ) Notice: Subject to any disclaimer, the term of this patent is extended or adjusted under 35 U.S.C. 154(b) by 117 days.

(21) Appl. No.: 09/887,885

(22) Filed: Jun. 22, 2001

(65) Prior Publication Data

US 2002/0199162 A1 Dec. 26, 2002

(51) Int. Cl.$^7$ ................................. G06F 17/50
(52) U.S. Cl. ............... 716/8; 716/4; 716/7; 716/17; 714/30; 712/14; 712/22; 438/281; 438/599; 438/618; 326/41; 250/492.1; 250/492.2
(58) Field of Search .................... 716/4, 7, 17, 8; 714/30; 712/22, 14, 42; 702/120; 700/231; 438/281, 599, 618; 345/615; 327/142; 326/41; 324/753; 250/492.22, 491.1

(56) References Cited

U.S. PATENT DOCUMENTS

| | | | |
|---|---|---|---|
| 5,136,186 A | 8/1992 | Trinh et al. | |
| 5,789,313 A | 8/1998 | Lee | |
| 6,093,631 A | 7/2000 | Jaso et al. | |
| 6,096,609 A | 8/2000 | Kim et al. | |
| 6,189,130 B1 * | 2/2001 | Gofman et al. | 716/7 |
| 6,484,300 B1 * | 11/2002 | Kim et al. | 716/7 |

* cited by examiner

Primary Examiner—Leigh M. Garbowski
Assistant Examiner—Helen B Rossoshek
(74) Attorney, Agent, or Firm—Daniel J. Long; Antony P. Ng; Bracewell & Patterson, L.L.P.

(57) ABSTRACT

A method for providing a fill pattern for integrated circuit designs is disclosed. A keepout file having keepout data is generated from a chip design layout file having chip design layout data. The keepout file includes a map of areas of an integrated circuit design where fill patterns cannot be placed. The map of areas from the keepout file is then overlaid with a fill pattern to yield a fill-pattern file. Fill patterns from the fill-pattern file is removed from locations that coincide with locations as defined by the keepout data to yield a final-fill file with crucial fill pattern data. The crucial fill pattern data from the final-fill file is overlaid on the design layout data in the chip design layout file to yield a complete design layout file. Finally, the design rule integrity and logical to physical correspondence of the complete design layout file is verified.

18 Claims, 3 Drawing Sheets

METHOD FOR PROVIDING A FILL PATTERN FOR AN INTEGRATED CIRCUIT DESIGN

BACKGROUND OF THE INVENTION

1. Technical Field

The present invention relates to integrated circuits in general, and in particular to a method for manufacturing integrated circuit devices. Still more particularly, the present invention relates to a method for providing a fill pattern for an integrated circuit design.

2. Description of the Prior Art

Generally speaking, an integrated circuit device is a layered interconnected structure formed by a series of processing steps during which metallization, dielectrics, and other materials are applied to the surface of a semiconductor wafer. During some of the processing steps, a chemical-mechanical polishing (CMP) procedure is commonly employed to achieve the degree of planarity required for producing ultra-high density integrated circuit devices. The CMP procedure typically involves pressing a semiconductor wafer against a moving polishing surface that is wetted with a chemically reactive, abrasive slurry. The slurry can be basic, acidic or neutral, and generally contains alumina or silica particles. The polishing surface is typically a planar pad made of a relatively soft, porous material such as blown polyurethane.

During the CMP procedure, the semiconductor wafer is typically secured to a carrier via vacuum or a mounting medium such as an adhesive. A force load is applied to the semiconductor wafer through the carrier by a pressure plate so as to press the semiconductor wafer into frictional contact with the polishing pad mounted on a rotating turntable. Both the carrier and pressure plate rotate as a result of the driving friction from the rotating turntable directly attached to the pressure plate. The semiconductor wafer is then transported across the polishing surface for polishing.

When using the CMP procedure to remove unwanted portions of metal layer to leave thin lines of metals as interconnects, problems such as dishing may occur, which leads to a non-planar surface. The dishing effect is particularly serious when the polishing needs to be carried out until metal is left exclusively in previously etched lines without any metal on the surface of a dielectric layer. It has been found that a significant overpolish is typically needed, which results in erosion of the dielectric layer and dishing of metal below the surface of the dielectric layer. As a result, the thickness of the interconnects in overpolished areas is severely reduced, resulting in an increased sheet resistance when compared to interconnects in other areas of the semiconductor wafer. Additionally, an uneven topography is introduced on the surface of the semiconductor wafer after the CMP procedure, which will be repeated with slight attenuation after subsequent deposition of dielectric layers problems during subsequent steps of the fabrication process. In most cases, fill patterns are typically utilized to alleviate the above-mentioned problems.

Fill patterns are added to chips in order to maintain an even distribution of design levels across a chip, which reduces the potential for defects on the chip due to uneven CMP polishing during the chip manufacturing process. Having a certain percentage of coverage for metal, polysilicon and diffusion has been a universal requirement for foundries. In order to meet those coverage requirements (or chip density requirements), chip designers typically add "dummy" (electrically inactive) layout shapes on each required levels. It has been determined that the best manufacturing yields are achieved when the dummy layout graphics resemble the active layout graphics.

There are two commonly used methods for meeting chip density requirements:

(1) Add filler cells: For standard cell or gate array application specific integrated circuit (ASIC) designs, cells are generated that resemble library cells in form factor. Such cells are fully populated with transistors tied off to electrical power or ground, and are used to completely fill rows of the ASIC where no functional circuits or wiring has been placed. With such, the polysilicon and diffusion coverage requirements are typically met.

(2) Generate a fill pattern: For metal layers, a checkerboard pattern of metal squares is generated. The checkerboard pattern is placed in the "white space" of the chip (areas of the chip where no design layers exist) to provide as much coverage as possible for the respective metal layers.

The problem with the first method is that it is limited to ASIC designs. It is made possible because of the regular structure of ASIC floor plans (rows of standard cell or gate array macros fitting a specific form factor). Filler cells are typically included in an ASIC library, and are placed as during post processing of an ASIC design. Full custom chip designs cannot use this methodology, as the design tools that implement such method must have "a priori" knowledge of the floor plan and power/ground bus structure. In addition, most design tools rely on design mapping generated by that tool during the place and route process. Unless the full custom design is placed and routed in the same manner as an ASIC, the first method will not work.

The second method is used for both ASIC and full custom chip designs, and is performed using vendor DRC tools. However, such tools are limited to generating the "checkerboard" pattern and removing portions of that pattern from areas of the chip with active circuitry and wiring. The checkerboard pattern, while useful for obtaining desired chip density, does not resemble actual layout circuitry. The checkerboard pattern is a simple pattern that can be realized by the geometric manipulation commands of most vendor DRC tools.

The present disclosure provides an improved method for providing a fill pattern during the manufacturing of integrated circuit devices.

SUMMARY OF THE INVENTION

In accordance with a preferred embodiment of the present invention, a keepout file having keepout data is generated from a chip design layout file having chip design layout data. The keepout file includes a map of areas of an integrated circuit design where fill patterns cannot be placed. The map of areas from the keepout file is then overlaid with a fill pattern to yield a fill-pattern file. Fill patterns from the fill-pattern file is removed from locations that coincide with locations as defined by the keepout data to yield a final-fill file with crucial fill pattern data. The crucial fill pattern data from the final-fill file is overlaid on the design layout data in the chip design layout file to yield a complete design layout file. Finally, the design rule integrity and logical to physical correspondence of the complete design layout file is verified.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The present invention may be executed in a variety of computers under a number of different operating systems. The computer may be, for example, a workstation, a midrange computer or a mainframe computer. In addition, the computer may be a stand-alone system or part of a network such as a local-area network (LAN) or a wide-area network (WAN). For the purpose of illustration, a preferred embodiment of the present invention, as described below, is implemented on a Unix workstation such as a Sun Ultrasparc Workstation.

Figure 1:
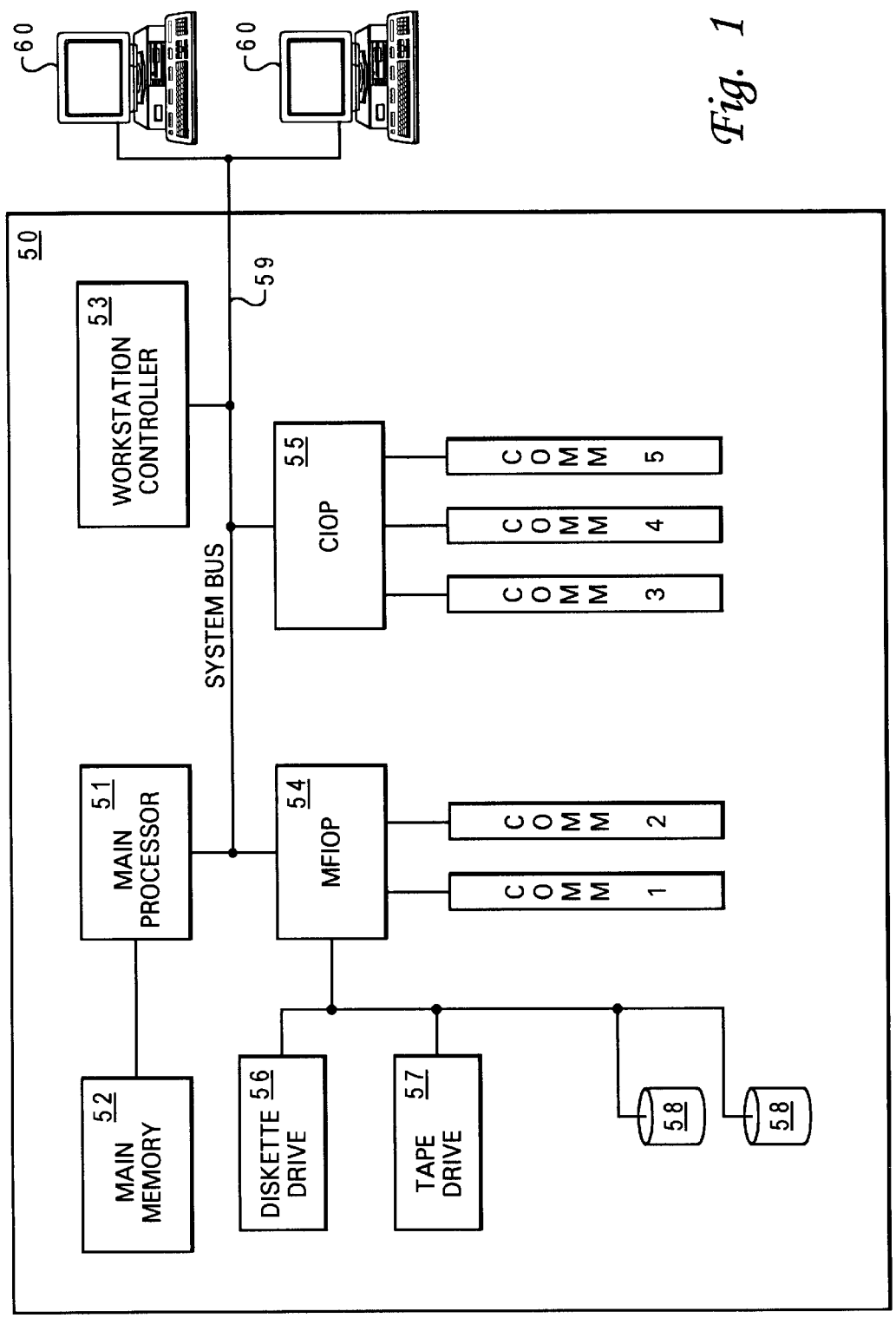
FIG. 1 is a block diagram of a computer system in which a preferred embodiment of the invention can be executed.

Referring now to the drawings and in particular to FIG. 1, there is illustrated a block diagram of a computer system in which a preferred embodiment of the invention can be executed. Within a computer system 50, a main processor 51 is coupled to a main memory 52 and to a multiple-function I/O processor (MFIOP) 54. Main processor 51 may include a single processor or multiple processors. Several peripheral storage devices such as a diskette drive 56, a tape drive 57, and direct access storage devices (DASDs) 58, are controlled by MFIOP 54. In addition, MFIOP 54 provides communications to other devices via communication ports such as COMM 1 and COMM 2.

Attached to a system bus 59 are a workstation controller 53 and a communications I/O processor (CIOP) 55. Workstation controller 53 provides communications between main processor 51 and workstations 60 that may be connected to computer system 50. CIOP 55 provides communications to other devices via communication ports such as COMM3, COMM4, and COMM5.

Figure 2:
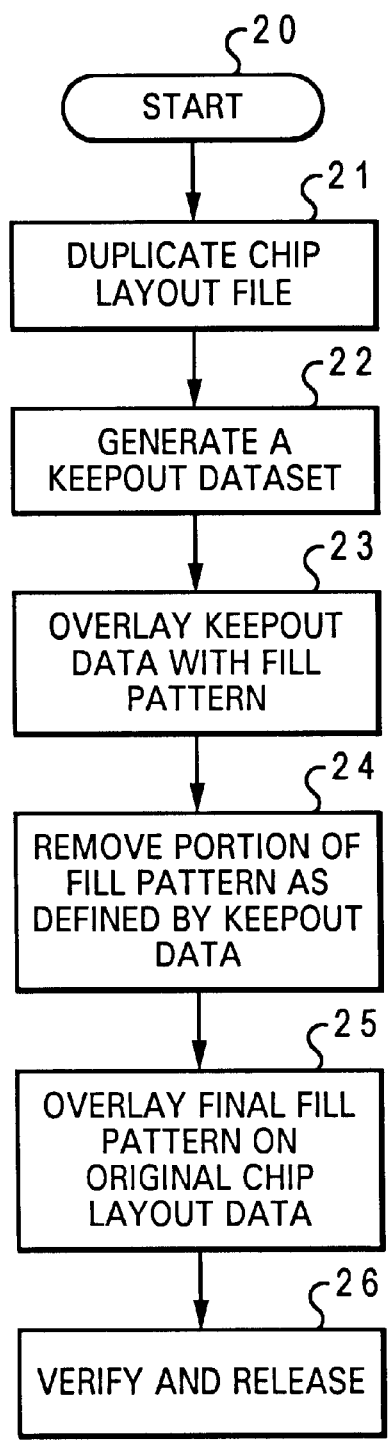
FIG. 2 is a high-level logic flow diagram of a method for providing a fill pattern during the manufacture of integrated circuit devices, in accordance with a preferred embodiment of the present invention.

With reference now to FIG. 2, there is illustrated a high-level logic flow diagram of a method for providing a fill pattern during the manufacture of integrated circuit devices, in accordance with a preferred embodiment of the present invention. Starting at block 20, a duplicate of an original chip layout file named ORG_LAYOUT is made, as shown in block 21. The duplicate chip layout file is named DUP_LAYOUT. Typically, the original chip layout file is in the form of a GDS II data file. GDS II is a universally recognized file format for representing chip design layout data. The duplicate chip layout file DUP_LAYOUT may be generated using translation tools to export the original chip layout data from a design database. The design database is a file system that maintains the graphic representations of a chip layout file. Data can generally be imported to or exported from the design database using translation tools that are included within integrated circuit design toolsets. Such translation tools are also required for releasing a design to manufacture, or commonly known as tape-out.

A keepout dataset is then generated from the duplicate chip layout file DUP_LAYOUT using a design rule checker (DRC) tool, as depicted in block 22. The keepout dataset includes a new layout made up of keepout polygons (or shapes) for indicating all the locations on a semiconductor wafer at which fill patterns cannot be placed. The keepout dataset is generated by analyzing the original chip layout data in the ORG_LAYOUT file. For example, fill patterns cannot be placed within a certain distance (in microns) of a poly_1 layer. The value of such distance is typically controlled by a process engineer. The process engineer also identifies all the layout layers for consideration. The keepout file is a map comprising polygon graphics representative of actual layout graphics. The keepout dataset can be represented in a GDS II data file named KEEPOUT file, which contains only keepout polygons.

Figure 3:
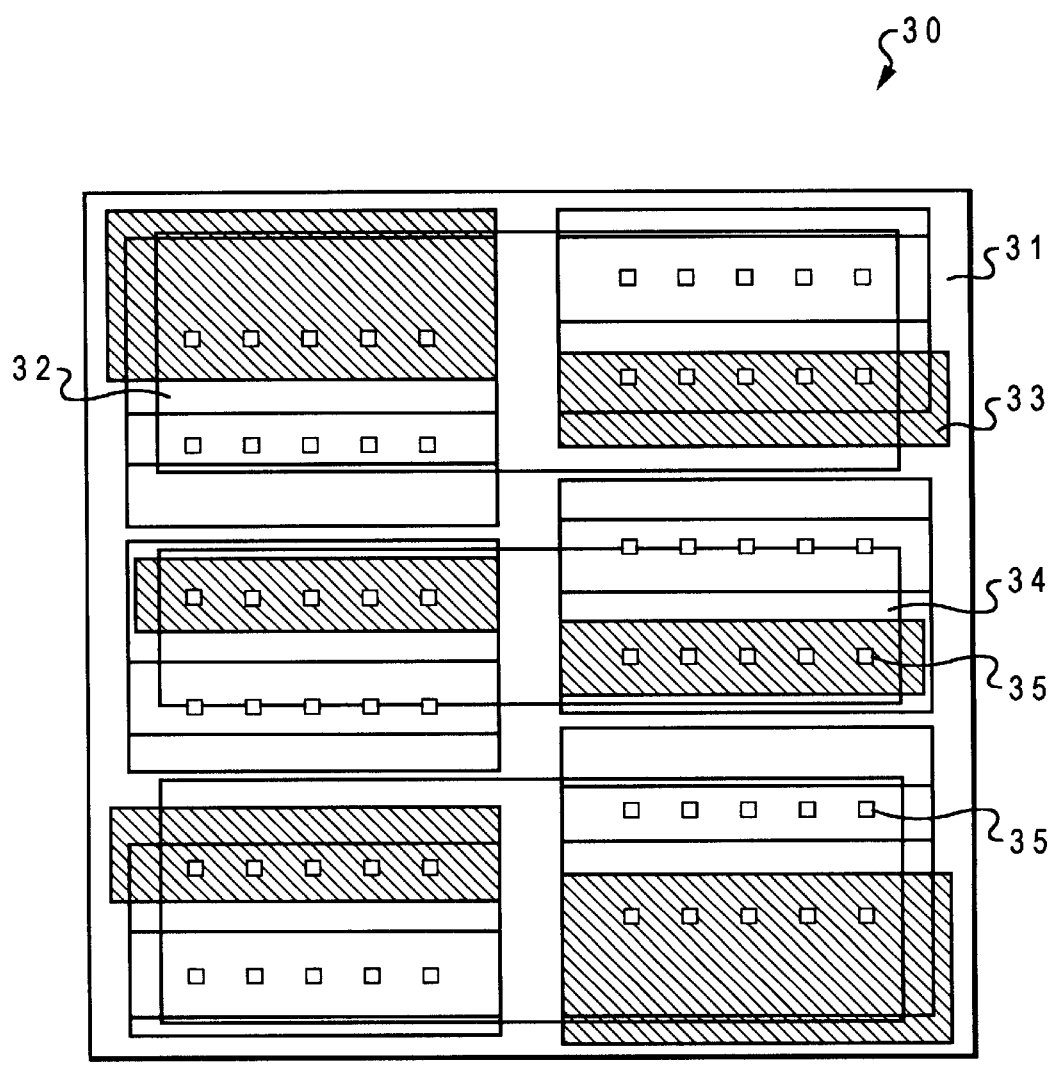
FIG. 3 is an exemplary drawing of a fill pattern, in accordance with a preferred embodiment of the present invention.

Next, the keepout data in the KEEPOUT file is overlaid with a fill pattern, as illustrated in block 23. A fill pattern is made up of an array of identical base cells that cover the entire chip design layout. An example of a fill pattern is depicted in FIG. 3. As shown, a fill pattern 30 includes a substrate layer 31, a diffusion layer 32, a polysilicon layer 33, a metal layer 34, via (not shown), and contacts 35. Preferably, fill patten 30 is connected to an electrical ground by having substrate layer 31 connected to an electrical ground. Fill pattern 30 may be initially formed as a base cell that can be modified or replaced by a physical designer. Diffusion polygons in the base cell are preferably designed to be p-type located in p-wells. A data manipulation routine (DMR) is preferably used to generate an array of base cells in the design database. The array of base cells preferably covers the entire chip area. The physical designer can edit the array to change the number of base cells within the array. The output file from block 23 is a FILLPATTERN file. The FILLPATTERN file is a predetermined array of layer graphics configurable by an user. The FILLPATTERN file, preferably contained in the design database, includes the layout data along with the keepout polygons and the fill patterns.

Subsequently, the portions of fill pattern as defined by keepout polygons are removed from the FILLPATTERN file, as shown in block 24. A data manipulation routine (DMR) is preferably run against the layout represented by the FILLPATTERN file. The Skill programming language is commonly used for the DMR, which can be easily ported to other programming languages, such as C, C++ or Perl, to work directly on the GDS II data. The DMR obtains coordinates of the bounding box of each base cell in the fill pattern array. If any portion of a keepout polygon is found within the area occupied by a base cell, the entire base cell is removed from the chip design layout. After all the base cells are processed, the keepout polygons are removed from the chip design layout. The remaining data in the chip design layout is the final fill pattern. The output file from block 24 is a FINAL_FILL file. A FINAL_FILL file is made up of hierarchial subcells independent of and separable from original layout graphics. The FINAL_FILL file, preferably contained in the design database, includes the layout data containing the final fill pattern for the chip.

Finally, the final fill pattern in the FINAL_FILL file is overlaid on the original chip layout data in the ORG_LAYOUT file, as depicted in block 25. In other words, the layout containing the final fill pattern is placed on the original layout in the design database. The origin of the final fill pattern data should be coincident with the original layout data. The layout containing the original data and final fill data is exported, and an ORC/LVS checking is performed as required for release to manufacturing, as illustrated in block 26. At this point, the design database should contain the original layout with the final fill pattern.

As has been described, the present invention provides an improved method for providing a fill pattern for an integrated circuit design. The method of the present invention is illustrated using a tool set manufactured by Cadence Corporation, but the method of the present invention is also applicable to any available tool set containing a DRC, such as tools from Avant! and Mentor Graphics. Furthermore, the method of the present invention uses vendor DRC tools simply to identify areas where fill pattern cannot be placed, i.e., areas where active circuitry is present. The DRC tool is not used to actually generate the fill pattern, nor is it used to remove unwanted fill pattern.

Although the method of the present invention is tailored for a full custom chip design, but it can also be applied to ASIC designs as well. The present invention provides for the use of a custom fill cell, which allows a user to generate a fill cell that resembles an active circuitry. For example, if the design is a memory device, the user can arrange the fill shapes to look like a base memory cell of the memory device. The fact that fill cells can be generated by a user also allows for the connection of shapes to the substrate of a chip.

It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for providing a fill pattern for an integrated circuit design, said method comprising:

generating a keepout file from a chip design layout file having chip design layout data, wherein said keepout file includes a map of areas of said integrated circuit design where fill patterns cannot be placed;

overlaying said map of areas from said keepout file with a fill pattern to yield a fill-pattern file;

removing fill patterns from said fill-pattern file at locations that coincide with locations as defined by said keepout data to yield a final-fill file having fill pattern data;

overlaying said fill pattern data from said final-fill file over said design layout data in said chip design layout file to yield a complete design layout file; and verifying design rule integrity and logical to physical correspondence of said complete design layout file.

2. The method of claim 1, wherein said fill patten includes a diffusion layer, a polysilicon layer, at least one metal layer, contacts, and vias.

3. The method of claim 2, wherein said method further includes a step of connecting said diffusion layer to electrical ground through a substrate layer of said integrated circuit design, such that said fill pattern is also connected to an electrical ground.

4. The method of claim 1, wherein said keepout file is a map comprising polygon graphics representative of actual layout graphics.

5. The method of claim 1, wherein said fill-pattern file is a predetermined array of layer graphics configurable by an user.

6. The method of claim 1, wherein said final-fill file is made up of hierarchical subcells independent of and separable from original layout graphics.

7. A computer program product residing on a computer usable medium for providing a fill pattern for an integrated circuit design, said computer program product comprising:

program code means for generating a keepout file from a chip design layout file having chip design layout data, wherein said keepout file includes a map of areas of said integrated circuit design where fill patterns cannot be placed;

program code means for overlaying said map of areas from said keepout file with a fill pattern to yield a fill-pattern file;

program code means for removing fill patterns from said fill-pattern file at locations that coincide with locations as defined by said keepout data to yield a final-fill file having fill pattern data;

program code means for overlaying said fill pattern data from said final-fill file over said design layout data in said chip design layout file to yield a complete design layout file; and program code means for verifying design rule integrity and logical to physical correspondence of said complete design layout file.

8. The computer program product of claim 7, wherein said fill patten includes a diffusion layer, a polysilicon layer, at least one metal layers, contacts, and vias.

9. The computer program product of claim 8, wherein said method further includes a step of connecting said diffusion layer to electrical ground through a substrate layer of said integrated circuit design, such that said fill pattern is also connected to an electrical ground.

10. The computer program product of claim 7, wherein said keepout file is a map comprising polygon graphics representative of actual layout graphics.

11. The computer program product of claim 7, wherein said fill-pattern file is a predetermined array of layer graphics configurable by an user.

12. The computer program product of claim 7, wherein said final-fill file is made up of hierarchical subcells independent of and separable from original layout graphics.

13. A computer system capable of providing a fill pattern for an integrated circuit design, said computer system comprising:

means for generating a keepout file from a chip design layout file having chip design layout data, wherein said keepout file includes a map of areas of said integrated circuit design where fill patterns cannot be placed;

means for overlaying said map of areas from said keepout file with a fill pattern to yield a fill-pattern file;

means for removing fill patterns from said fill-pattern file at locations that coincide with locations as defined by said keepout data to yield a final-fill file having fill pattern data;

means for overlaying said fill pattern data from said final-fill file over said design layout data in said chip design layout file to yield a complete design layout file; and means for verifying design rule integrity and logical to physical correspondence of said complete design layout file.

14. The computer system of claim 13, wherein said fill patten includes a diffusion layer, a polysilicon layer, at least one metal layers, contacts, and vias.

15. The computer system of claim 14, wherein said method further includes a step of connecting said diffusion layer to electrical ground through a substrate layer of said integrated circuit design, such that said fill pattern is also connected to an electrical ground.

16. The computer system of claim 13, wherein said keepout file is a map comprising polygon graphics representative of actual layout graphics.

17. The computer system of claim 13, wherein said fill-pattern file is a predetermined array of layer graphics configurable by an user.

18. The computer system of claim 13, wherein said final-fill file is made up of hierarchical subcells independent of and separable from original layout graphics.

* * * * *

UNITED STATES PATENT AND TRADEMARK OFFICE
CERTIFICATE OF CORRECTION

| | |
|---|---|
| PATENT NO. | : 6,609,235 B2 |
| APPLICATION NO. | : 09/887885 |
| DATED | : August 19, 2003 |
| INVENTOR(S) | : Ramaswamy et al. |

Page 1 of 1

It is certified that error appears in the above-identified patent and that said Letters Patent is hereby corrected as shown below:

On the Title Page, in Item (75), under "Inventors", in Column 1, Line 4, delete "Tatia E." and insert -- Tatia B. --, therefor.

In the Specifications:

In Column 4, Line 20, delete "patten 30" and insert -- pattern 30 --, therefor.

In Column 4, Line 32, delete "an user." and insert -- a user. --, therefor.

In Column 4, Line 51, delete "hierarchial" and insert -- hierarchical --, therefor.

In the Claims:

In Column 5, Line 54, in Claim 2, delete "patten" and insert -- pattern --, therefor.

In Column 5, Line 66, in Claim 5, delete "by an" and insert -- by a --, therefor.

In Column 6, Line 28, in Claim 8, delete "patten" and insert -- pattern --, therefor.

In Column 6, Line 40, in Claim 11, delete "an user." and insert -- a user. --, therefor.

In Column 6, Line 66, in Claim 14, delete "patten" and insert -- pattern --, therefor.

In Column 8, Line 3, in Claim 17, delete "an user." and insert -- a user. --, therefor.

Signed and Sealed this
Twenty-third Day of April, 2013

Teresa Stanek Rea
*Acting Director of the United States Patent and Trademark Office*